United States Patent
Aggarwal et al.

(10) Patent No.: US 6,566,891 B1
(45) Date of Patent: May 20, 2003

(54) MEASUREMENT SYSTEM AND METHOD OF DETERMINING CHARACTERISTICS ASSOCIATED WITH A WAVEFORM HAVING DISTORTION ASSOCIATED THEREWITH

(75) Inventors: Akshay Aggarwal, Blauvelt, NY (US); Kadaba R. Lakshmikumar, Basking Ridge, NJ (US)

(73) Assignee: Agere Systems Inc., Allentown, PA (US)

( * ) Notice: Subject to any disclaimer, the term of this patent is extended or adjusted under 35 U.S.C. 154(b) by 6 days.

(21) Appl. No.: 09/684,259

(22) Filed: Oct. 6, 2000

(51) Int. Cl.$^7$ ............................................. G01R 23/20
(52) U.S. Cl. ...................................... 324/620; 327/317
(58) Field of Search .................. 324/620, 619, 324/148, 601, 158.1, 532–535, 623; 375/18, 32, 220, 224, 284–285; 327/317, 356, 358–359; 348/180, 184, 192

(56) References Cited

U.S. PATENT DOCUMENTS

| | | | |
|---|---|---|---|
| 3,775,688 A | * 11/1973 | Hinoshita et al. | 375/320 |
| 3,956,601 A | * 5/1976 | Harris et al. | 379/21 |
| 4,070,615 A | * 1/1978 | Crop | 324/619 |
| 4,253,057 A | * 2/1981 | Carlton et al. | 324/620 |
| 4,584,690 A | * 4/1986 | Cafiero et al. | 375/18 |
| 4,739,276 A | * 4/1988 | Graube | 324/534 |
| 4,908,576 A | * 3/1990 | Jackson | 324/158 F |
| 5,072,187 A | * 12/1991 | Shilo | 324/620 |
| 5,751,766 A | * 5/1998 | Kletsky et al. | 348/184 |
| 6,407,609 B1 | * 6/2002 | Aggarwal et al. | 327/317 |

OTHER PUBLICATIONS

"As Edge Speeds Increase, Wires Become Transmissions Lines" by James Sutherland, California Micro Devices: from EDN Magazine: Oct. 1999: pp. 75–94.

Application Note—"Reflecting on Transmission Line Effects" Motorola Semiconductor Technical Data: AN1061:1990: pp. 1–11 (Month Unavailable).

Application Note—"Transmission Line Effects in PCB Applications" Motorola Semiconductor: AN1051: 1990: pp. 1–29, Appendix pp. A1–A39 (Month Unavailable).

* cited by examiner

Primary Examiner—Kamand Cuneo
Assistant Examiner—Minh N. Tang (57) ABSTRACT

The present invention provides a measurement system and a method of determining characteristics associated with a waveform that compensate for distortion associated therewith. In one embodiment, the measurement system includes a monitoring device that detects distortion in a waveform propagating along the transmission medium. The measurement system further includes a computational subsystem that generates a precompensation signal and precompensation value as a function of the distortion in the waveform. The precompensation value substantially compensates for the distortion when inserted into the waveform as a function of the precompensation signal.

12 Claims, 6 Drawing Sheets

MEASUREMENT SYSTEM AND METHOD OF DETERMINING CHARACTERISTICS ASSOCIATED WITH A WAVEFORM HAVING DISTORTION ASSOCIATED THEREWITH

CROSS-REFERENCE TO RELATED APPLICATION

This application is related to U.S. patent application Ser. No. 09/684,260, entitled "A Distortion Precompensator and Method of Compensating for Distortion in a Transmission Medium," by Akshay Aggarwal, et al., filed on Oct. 6, 2000.

TECHNICAL FIELD OF THE INVENTION

The present invention is directed, in general, to electronic circuits and, more specifically, to a measurement system and a method of determining characteristics associated with a waveform that compensate for distortion associated therewith.

BACKGROUND OF THE INVENTION

A continuing trend in telecommunications networks is the higher data rate associated with the transfer of data. To achieve such high speeds of data transfer, conventional telecommunications networks include output buffers that produce signal pulses, or waveforms, for transmission over a telecommunications line. The output buffers are generally employed in transmission devices to drive a signal to a destination location such as a receiver. Such signals can traverse, via the transmitter, a transmission medium (e.g., a board trace, a cable or other electrically conductive medium) before arriving at the destination location.

Complications, however, arise in connection with the transmission of information across the transmission medium. For instance, mismatches in impedance at interfaces located within the telecommunication network can cause distortion in the transmission medium in the form of reflections of the incident wave, which may then travel back to the source of information. This is particularly noticeable when signals travel through the interface of the board trace and the cable having different impedances. In such situations, an initial reflection wave may be generated back to the transmitting output buffer. If the transmitting output buffer has an impedance which is different from that of the board trace, a subsequent reflection wave may be generated, which then travels back to the destination location. Due to this iterative behavior, a "staircase" effect may be exhibited in the waveform at the output. Also, the staircase effect is usually pattern dependent, and hence, may potentially induce data dependent jitter. Moreover, with the current trend of very high speeds of data transfer, where the output rise and fall times are much faster with respect to the cable lengths, the problem of reflection becomes even more troublesome.

To overcome the "staircase" effect caused by the mismatches in impedance, telecommunications network designers currently attempt to match the output impedance of the output buffer with the other impedance characteristics associated with the telecommunications network, including the characteristic impedance of the board trace. Theoretically, if the impedances of the output buffer and the board trace match, any reflection caused by the impedance mismatch between the board trace and the cable should be fully absorbed. In such situations, and assuming that no other reflections are generated in other portions of the transmission medium, a transmitted signal should attain a clean response. While in theory the principle is sound, realistically it is very difficult to match the impedances of the output buffer and the board trace. Moreover, the techniques presently available to match the impedances are expensive and time consuming to implement.

Accordingly, what is needed in the art is a system that determines characteristics associated with a waveform propagating along a transmission medium that compensates for distortion associated therewith that overcomes the deficiencies of the prior art.

SUMMARY OF THE INVENTION

To address the above-discussed deficiencies of the prior art, the present invention provides a measurement system for use with a transmission medium. In one embodiment, the measurement system includes a monitoring device that detects distortion in a waveform propagating along the transmission medium. The measurement system further includes a computational subsystem that generates a precompensation signal and precompensation value as a function of the distortion in the waveform. The precompensation value substantially compensates for the distortion when inserted into the waveform as a function of the precompensation signal.

The present invention introduces, in one aspect, a measurement system that determines a precompensation value and precompensation signal that compensates for distortion in a transmission medium of a telecommunications network. In another aspect, the present invention provides a method of determining characteristics associated with a waveform that compensate for distortion associated therewith. The method includes (1) monitoring a waveform propagating along a transmission medium to detect distortion associated therewith, and (2) generating a precompensation signal and precompensation value as a function of the signal. The precompensation value substantially compensates for the distortion when inserted into the waveform as a function of the precompensation signal.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
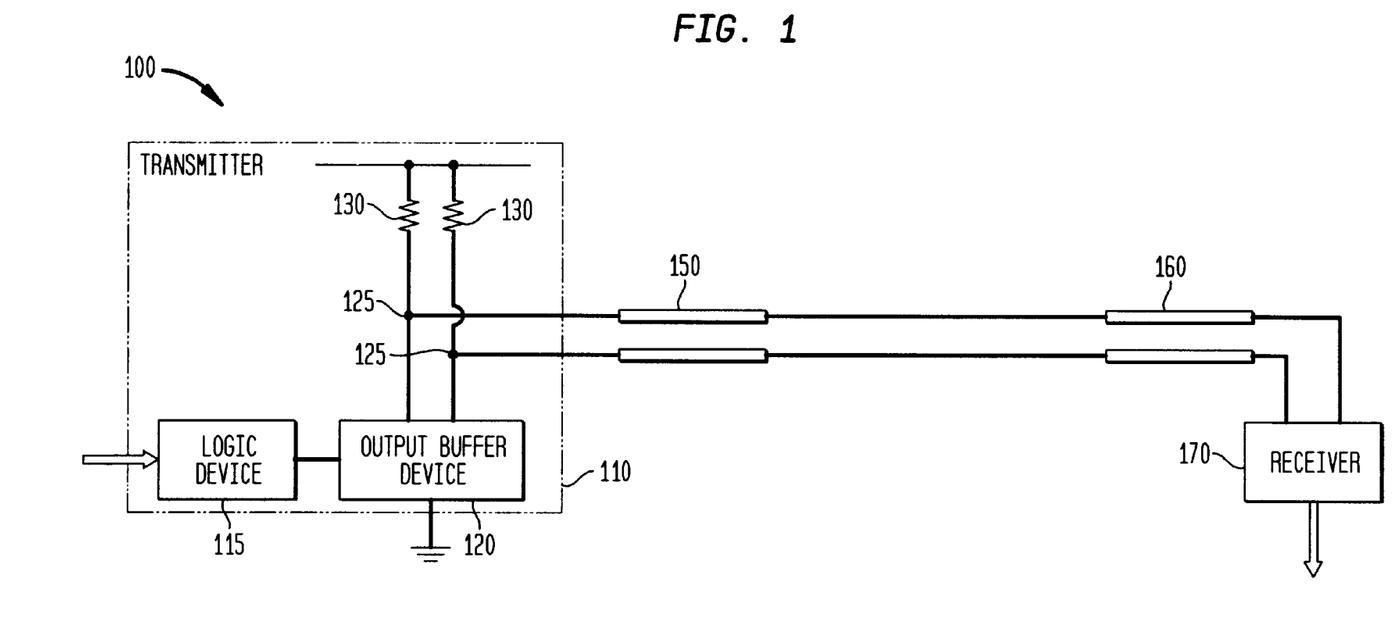
FIG. 1 illustrates a block diagram of a telecommunications network providing an environment for application of the principles of the present invention.

Referring initially to FIG. 1, illustrated is a block diagram of a telecommunications network 100 providing an environment for application of the principles of the present invention. The telecommunications network 100 can accommodate high speed data transfer and includes a transmitter 110, which transmits a signal from one point to a destination location (e.g., a receiver 170). The transmitter 110 includes a logic device 115 (e.g., a logic mixed signal device) and an output buffer device 120 (e.g., a current mode logic (CML) buffer that generates an output signal). The output buffer device 120 has an ouput impedance associated therewith. The net impedance of the output buffer device 120, in the current example, is about 50Ω, which takes into account an on chip resistive termination 130.

A transmitted signal from the transmitter 110 (via a source node 125) traverses a transmission medium including a board trace 150 and a coaxial cable 160. The coaxial cable 160 carries the output signal to a destination location, including the receiver 170. The board trace 150 and coaxial cable 160 have a characteristic impedance. In the current example, the board trace 150 and coaxial cable 160 have impedances of about 30Ω and about 50Ω, respectively.

The telecommunications network 100 may experience distortion associated with the transmission medium. The distortion, which principally occurs in the form of a reflection signal, generally arises from mismatches in impedance at interfaces located within the telecommunications network 100. In the telecommunications network 100, the mismatches in impedance can occur between the output buffer device 120, the board trace 150 and the coaxial cable 160. A mismatch in impedance between the board trace 150 and coaxial cable 160 generates an initial reflection that is reflected back to the output buffer device 120. Since the output buffer device 120 has a different impedance than the board trace 150, a subsequent reflection is generated which traverses the coaxial cable 160. Due to this iterative behavior, a "staircase" effect is exhibited in the waveform at the output, which ultimately affects the quality of the transmitted signal received at the receiver 170.

Figure 2:
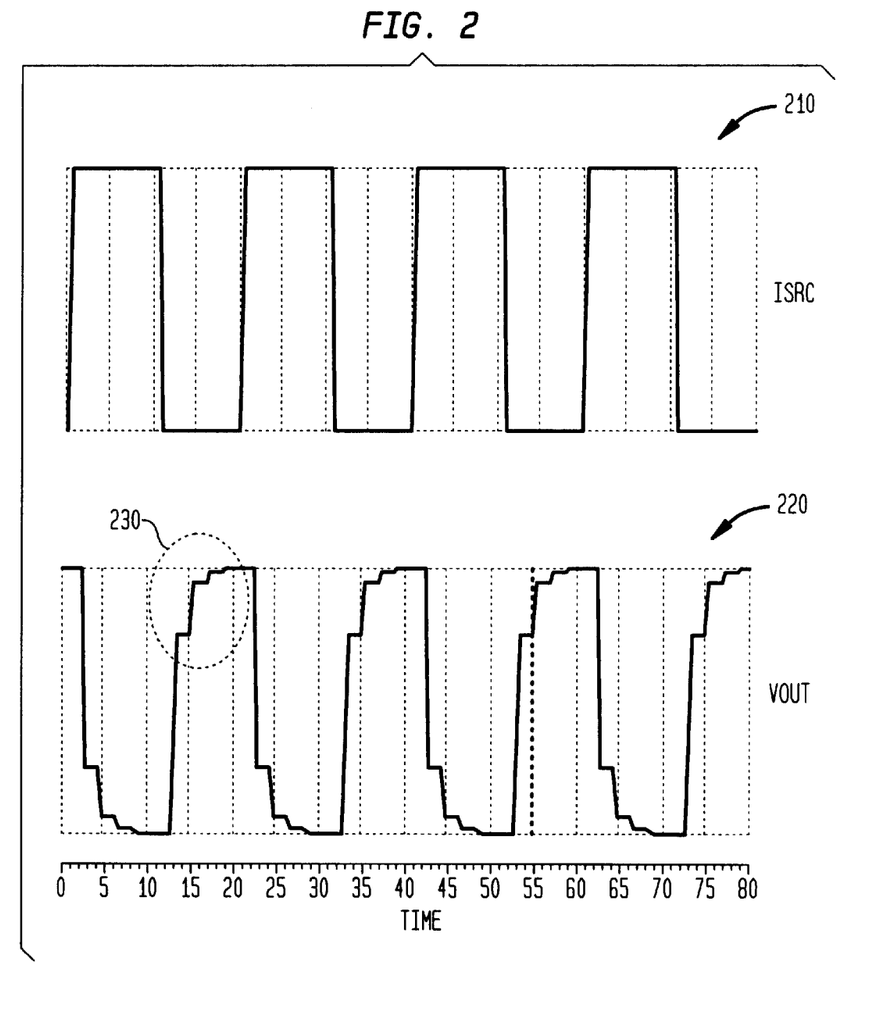
FIG. 2 illustrates graphical representations of a current waveform at a node associated with the transmitter and an output voltage waveform at the receiver of the telecommunications network of FIG. 1.

FIG. 2 illustrates graphical representations of a current waveform 210 at the source node 125 associated with the transmitter 110, and an output voltage waveform 220 at the receiver 170 of the telecommunications network of FIG. 1. As demonstrated by the present example, the current waveform 210 enters the board trace 150 having two discrete levels. The output voltage waveform 220, however, arrives at the receiver 170 having many discrete levels, including a staircase effect 230. The staircase effect 230 is a function of distortion associated with the transmission medium such as mismatches in impedance between the output buffer device 120, the board trace 150 and coaxial cable 160. The distortion ultimately degrades the quality of the transmitted signal propagating along the transmission medium.

Figure 3:
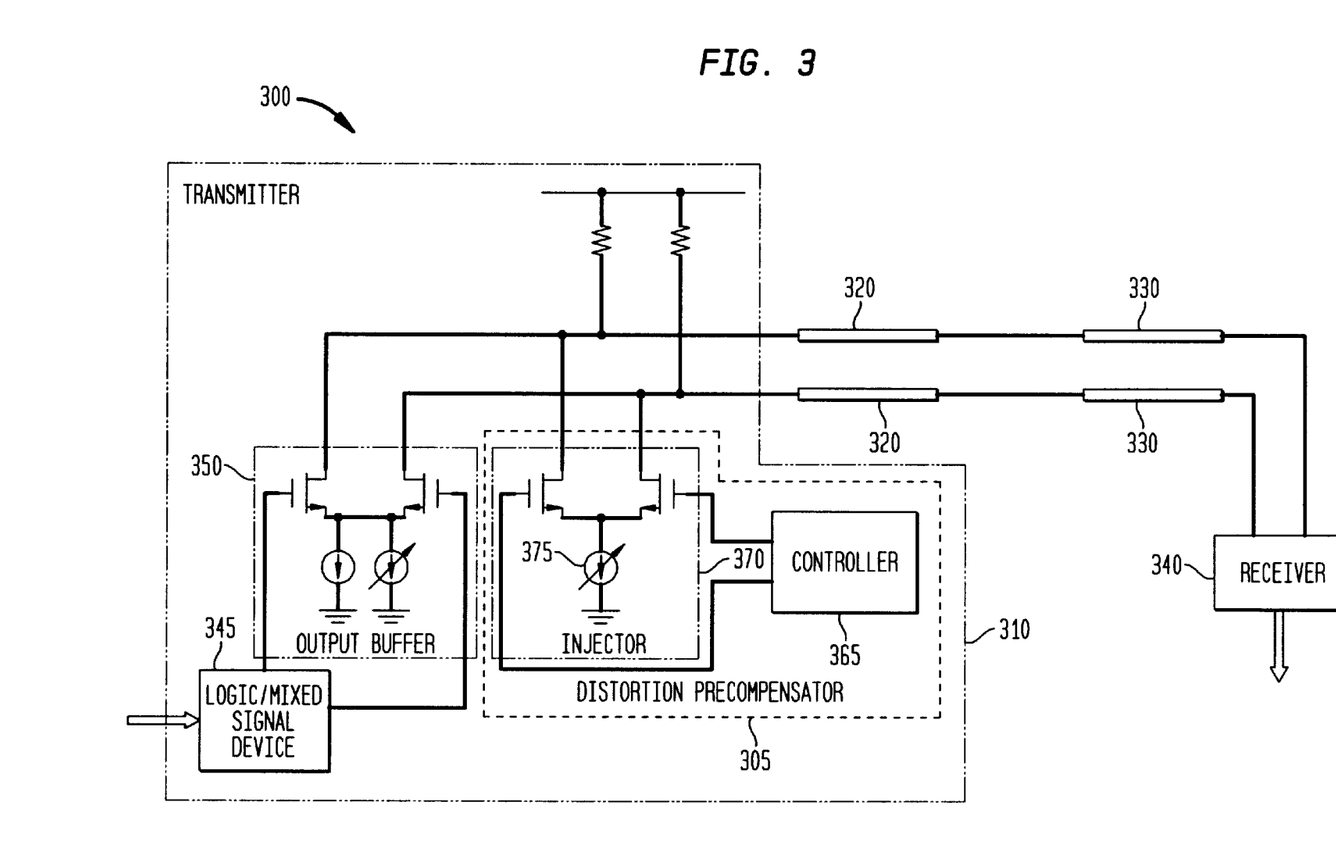
FIG. 3 illustrates a block diagram of a telecommunications network employing an embodiment of a transmitter with a distortion precompensator constructed according to the principles of the present invention.

FIG. 3 illustrates a block diagram of a telecommunications network 300 employing an embodiment of a transmitter 310 with a distortion precompensator 305 constructed according to the principles of the present invention. The distortion precompensator 305 substantially reduces distortion in a waveform propagating along a transmission medium of the telecommunications network 300 and hence can substantially reduce deleterious effects, such as the staircase effect 230 in the output voltage waveform 220 illustrated and described with respect to FIG. 2.

The telecommunications network 300 includes the transmitter 310, which is coupled by a board trace 320 and a coaxial cable 330, to a receiver 340. The transmitter 310, in the illustrated embodiment, includes a logic/mixed signal device 345 that receives data (such as voice or video information) to be transmitted. The data is typically low speed parallel data, and the logic/mixed signal device 345 converts that data to high speed serial data. The transmitter 310 also includes an output buffer 350 that transforms the data into a waveform and transmits the waveform through the board trace 320 and the coaxial cable 330.

The distortion precompensator 305 may be used to substantially compensate for distortion in the coaxial cable 330, which may occur as a result of occasional differences in impedance at interfaces located within the telecommunications network 300. The distortion precompensator 305 includes a controller 365 that employs a predetermined precompensation signal. The distortion precompensator 305 further includes an injector 370 that injects a predetermined precompensation value into the waveform, as a function of the precompensation signal.

Figure 4:
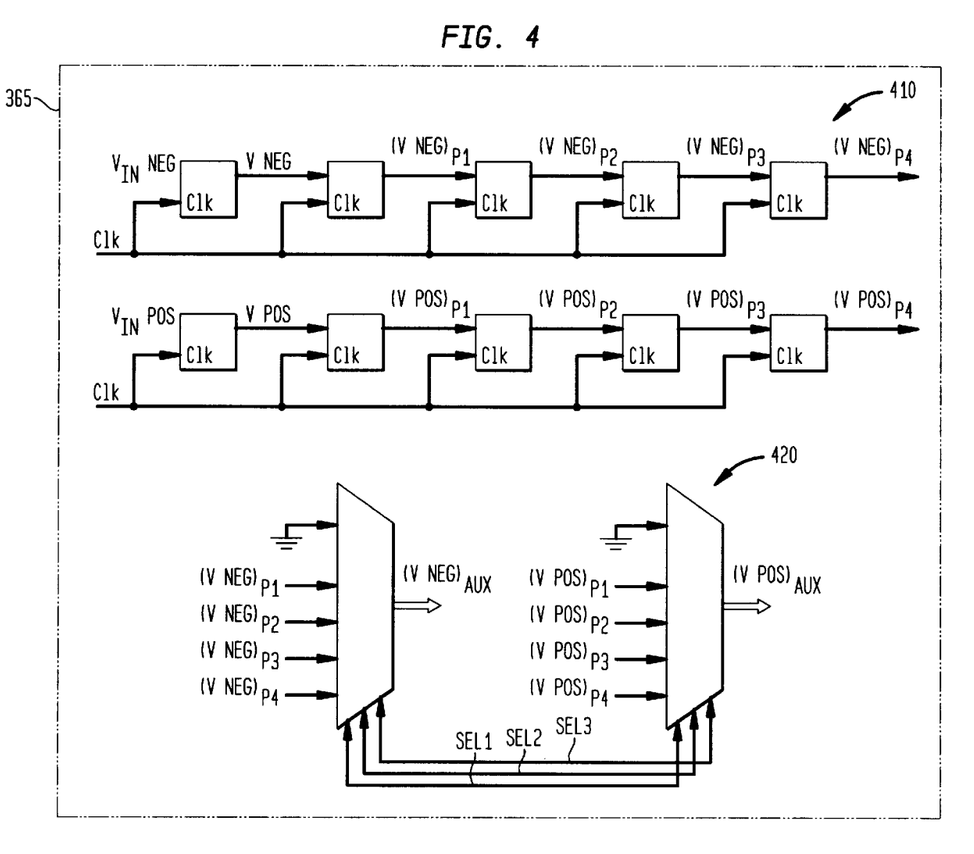
FIG. 4 illustrates a block diagram of an embodiment of a controller constructed according to the principles of the present invention.

FIG. 4 illustrates a block diagram of an embodiment of portions of the controller 365 of FIG. 3. In the illustrative embodiment, the controller 365 includes one or more cascading flip flops (generally designated 410) and a multiplexer 420. The cascading flip flops 410 and the multiplexer 420, in combination, provide differential signals to the injector 370, in the form of the precompensation signal. The flip flops 410 can generate different phases of the input data (in the form of a train of pulses V POS and V NEG) and an appropriate phase is thereafter selected through the multiplexer 420. The phase selection is dependent on the nature of mismatch in impedance associated with the transmission medium contained within the telecommunications network 300. By analyzing the width of steps within the aforementioned "staircase" effect, one can choose the appropriate phase from the multiplexer. The precompensation signal can also include one or more signals indicating a timing instant when the precompensation value may be injected; a time duration for which the precompensation value may be injected; or a polarity of the precompensation value. Of course, those skilled in the art understand that the precompensation signal may include all three variables. It should also be noted that the precompensation signal is not limited to just the previously mentioned three variables, and that other known or hereafter discovered variables may be included in conjunction with the precompensation signal.

Referring back to FIG. 3, the injector 370, as previously mentioned, injects a precompensation value into the waveform, as a function of the precompensation signal. In one aspect of the invention, the precompensation value is in the form of a current level, and is provided by a programmable, or variable, current source 375. The distortion precompensator 305 pre-distorts the input incident waveform using the precompensation value. The precompensation value, as previously stated, is injected as a function of the precompensation signal, i.e., the timing instant, duration and polarity of the programmable current source. It should be understood, however, that the precompensation value may be in the form of a voltage superimposed on the waveform, as a function of the precompensation signal, to substantially compensate for distortion associated therewith.

Figure 5:
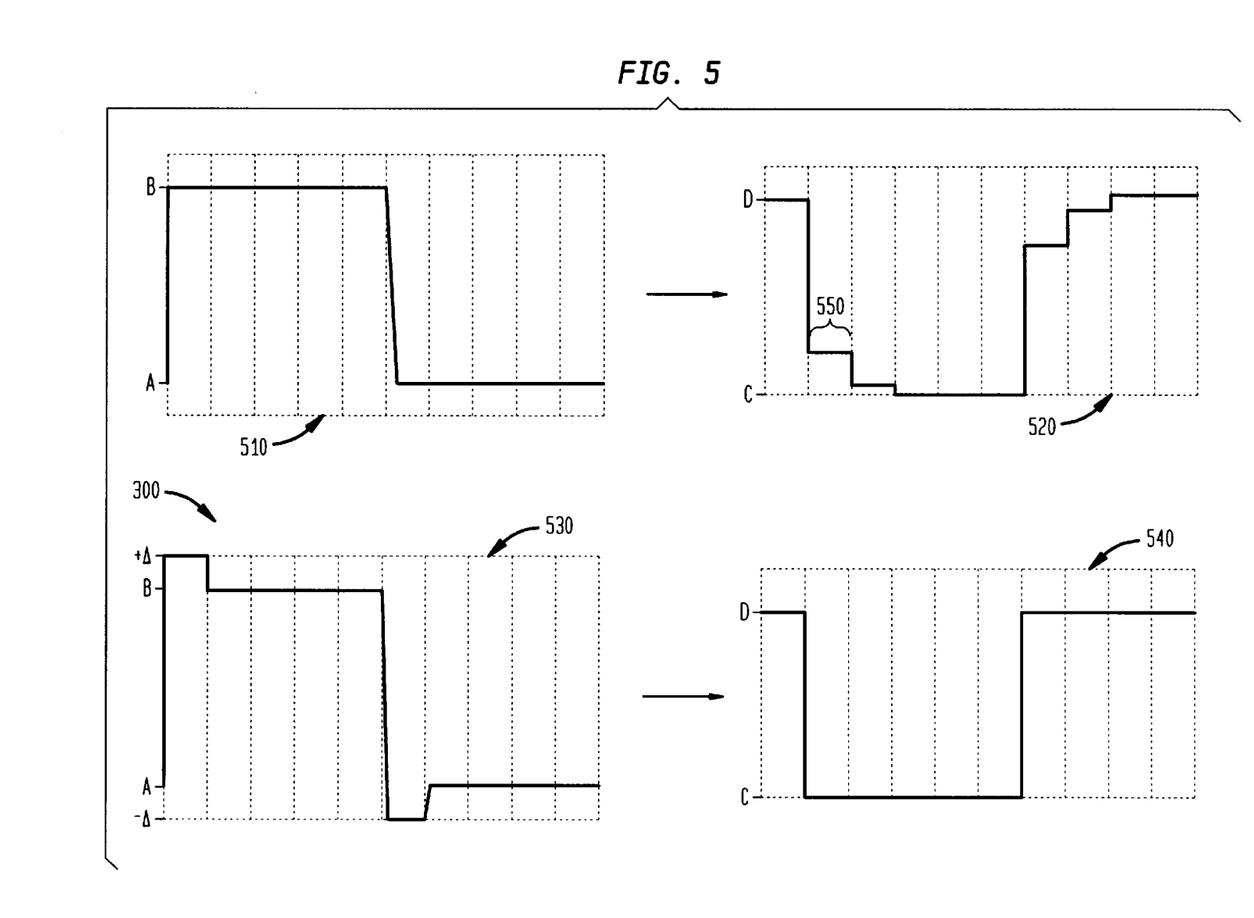
FIG. 5 illustrates graphical representations of selected parameters of the telecommunications network of FIG. 3 demonstrating the advantages associated with the principles of the present invention.

Turning now to FIG. 5, illustrated are graphical representations of selected parameters of the telecommunications network 300 of FIG. 3 demonstrating the advantages associated with the principles of the present invention. More specifically, FIG. 5 illustrates a traditional input waveform 510, generated at the output buffer 350, without employing the distortion precompensator 305. An output waveform 520 of FIG. 5 represents the input waveform 510 after traversing the board trace 320 and coaxial cable 330, including any possible impedance mismatches. As can be ascertained, the output waveform 520 experiences distortion, which is represented by the stairstep function 550 in the output waveform 520.

FIG. 5 also shows an input waveform 530, in connection with the telecommunications network 300 employing a transmitter 310, having a distortion precompensator 305 constructed according to the principles of the present invention. The input waveform 530 also includes the precompensation value (represented by +Δ and −Δ) inserted as a function of the precompensation signal. As illustrated by the graphical representation, the output waveform 540 does not include the stairstep function, suggesting that the distortion is substantially compensated for. Thus, the inclusion of the precompensation value in the input waveform 530 substantially compensates for any measurable distortion.

Again referring to FIG. 3, the first step in calibrating the distortion precompensator 305 is to determine the precompensation value and precompensation signal associated with the coaxial cable 330 of the respective telecommunications network 300. It should be noted that the precompensation value and precompensation signal, once determined for a particular transmission medium, typically remains unchanged. Thus, the precompensation value and precompensation signal used to substantially correct a distortion in one waveform, may be used to substantially correct distortion in any waveform traversing the coaxial cable 330, given that the telecommunications network 300 remains substantially unchanged.

Figure 6:
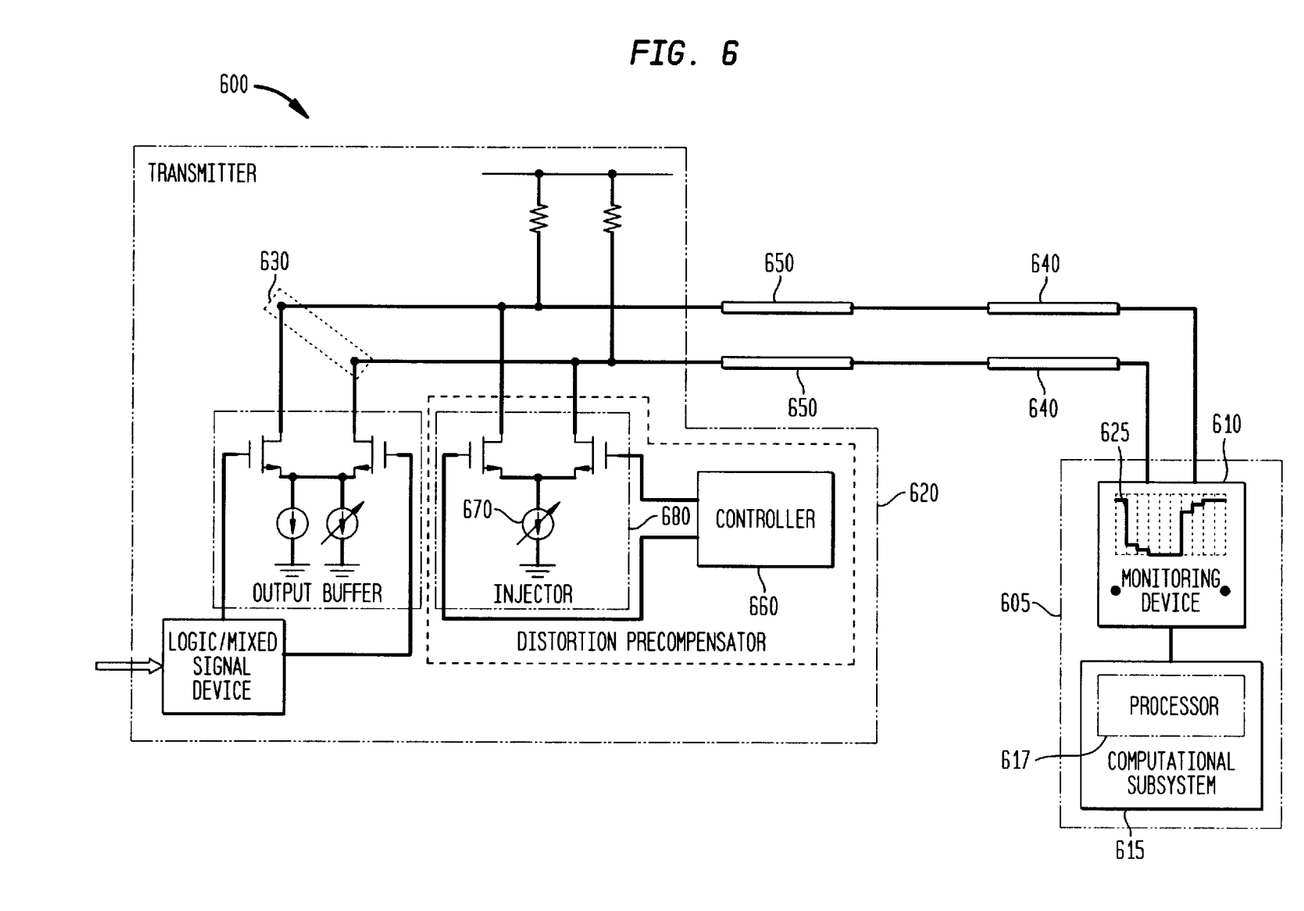
FIG. 6 illustrates a block diagram of a telecommunications network employing an embodiment of a measurement system, and constructed according to the principles of the present invention.

Turning now to FIG. 6, illustrated is a block diagram of a telecommunications network 600 employing an embodiment of a measurement system 605, and constructed according to the principles of the present invention. As shown in FIG. 6, the measurement system 605 includes a monitoring device 610 and a computational subsystem 615. The computational subsystem 615 may comprise many devices and perform many functions, however, in an illustrative embodiment, the computational subsystem 615 may include a processor (e.g., a digital signal processor or microprocessor) 617 and may at least partially be embodied in a sequence of operating instructions.

The precompensation signal and precompensation value are generally determined, for a particular transmitter 620, by subjecting the telecommunications network 600 to any waveform, and using the monitoring device 610 to detect distortion in the waveform propagating along the coaxial cable 640. In one embodiment of the present invention, the distortion in the waveform is detected using an oscilloscope associated with the monitoring device 610. Those skilled in the art, however, understands that many other monitoring devices 610 can be used to measure and observe the distortion. In the illustrated embodiment, the distortion may be observed in an output waveform analogous to the output waveform 520 illustrated in FIG. 5.

The computational subsystem 615, coupled to the monitoring device 610, then generates the precompensation signal and precompensation value. The precompensation signal represents, for instance, the timing instant, the duration of time and the polarity of the precompensation value, and the precompensation value generally represents the amplitude or intensity. It should be noted that the precompensation signal and precompensation value could represent other characteristics, and therefore, they are not limited by the aforementioned characteristics.

As previously stated, the computational subsystem 615 may determine the duration of time for which the precompensation value may be applied to substantially compensate for distortion. The duration of time for which the precompensation value may be applied, is such that it matches the time delay for a reflection to travel from its origination point through a source node 630, across the coaxial cable 640, and back to the origination point. With reference to FIG. 5, the duration may be represented in the output waveform 520 by a shelf width 550. The computational subsystem 615 employs the information produced by the monitoring device 610 to determine this duration. In the given example, the computational subsystem 615 could determine the duration to be about 2 bit periods, which is a time of about 1 ns. The duration determined from the computational subsystem 615 would then be programmed into a controller 660.

Assuming for the sake of discussion that the controller 660 includes multiple flip flops analogous to the controller 365 illustrated and describe with respect to FIGS. 3 and 4, the output of the third flip flop of the controller 660, which is about 2 bit periods away from the output of the first flip flop, may be selected by the multiplexer to derive the duration to apply the precompensation value via an injector 680. Using a similar procedure, the computational subsystem 615 could generate the timing instant that the precompensation value should be applied and the polarity of the precompensation value, both being programmed into the controller 660.

As previously stated, the computational subsystem 615 may also be used to determine the amplitude of the precompensation value. In the given example, the amplitude of the precompensation value is representative of the amount of mismatch between the coaxial cable 640 and the board trace 650. The computational subsystem 615 may determine the amplitude of the precompensation value using many processes, however, two such processes are illustrated below. First, the computational subsystem 615 could generate the precompensation value combining multiple known characteristics of the telecommunications network 600 with observed characteristics of the waveform. For example, the computational subsystem 615 could employ the known characteristics and observed characteristics into mathematical equations to determine the precompensation value. One of such equations, may be as follows:

$$I_{COR} = \left( \frac{R_{SRC}}{R_{SRC} + R_{OUT}} \right)$$

-continued $$\left(\frac{1+\left(\frac{1-\Gamma_{SRC}}{\Gamma_{SRC}-1}\right)}{1}\right)\left((I_{SRC})(\Gamma_{SRC})\right)\left(\frac{1-\left(\frac{V_{OUTTI}\left(1+\left(\frac{1-\Gamma_{SRC}}{\Gamma_{SRC}+1}\right)\right)}{(I_{SRC})(R_{OUT})}\right)}{1-\left(1-\left(\frac{V_{OUTTI}\left(1+\left(\frac{1-\Gamma_{SRC}}{\Gamma_{SRC}+1}\right)\right)}{(I_{SRC})(R_{OUT})}\right)\right)}\right)$$

where, $R_{SRC}$=impedance at the $SRC_{NODE}$ (known characteristic), $R_{OUT}$=impedance at the output (known characteristic), $I_{SRC}$=input current at the SRCNODE (known characteristic), $V_{OUTT1}$=is the output voltage when a first waveform is detected by the monitoring device 610, $V_{OUTT2}$=is the ouput voltage when a second waveform is detected by the monitoring device 610, $\Gamma_{SRC}$ may be solved by one skilled in the art using the quadratic equation:

$\Gamma_{SRC}^2(R_{OUT})(I_{SRC})(V_{OUTT1})+\Gamma_{SRC}[(V_{OUTT1})(R_{OUT})(I_{SRC})-2V_{OUTT1}^2-(R_{OUT})(I_{SRC})(V_{OUTT2})]-(R_{OUT})(I_{SRC})(V_{OUTT2})=0$ where, the other parameters have already been defined above.

The computational subsystem 615 could also generate the precompensation value using a second method. In such a method, the previously determined precompensation signal, would be programmed into the controller 660. The computational subsystem 615 would then vary, in an iterative process, the precompensation value of a current source 670, as it observes the waveform. By observing a waveform substantially free of distortion, the computational subsystem 615 will have substantially determined the precompensation value that substantially compensates for mismatches in impedance at interfaces located within the given telecommunications network 600.

Using either of the above-mentioned methods, or any other accurate and known method, the precompensation value determined using the measurement system 605 could then be programmed into an injector 680. This could be accomplished by selecting the precompensation value from a current level bank. Likewise, the timing instant that the precompensation value should be applied, duration of time for which the precompensation value should be applied and the polarity of the precompensation value would also be programmed, collectively as a precompensation signal, into the controller 660.

Although the present invention has been described in detail, those skilled in the art should understand that they can make various changes, substitutions and alterations herein without departing from the spirit and scope of the invention in its broadest form.

What is claimed is:

1. A measurement system for use with a transmission medium, comprising:

a monitoring device configured to detect distortion caused by impedance mismatches associated with said transmission medium in a waveform propagating along said transmission medium; and a computational subsystem configured to generate a precompensation signal and precompensation value as a function of said distortion in said waveform, said precompensation value substantially compensating for said distortion when inserted into said waveform as a function of said precompensation signal.

2. The measurement system as recited in claim 1 wherein said precompensation signal comprises at least one of a timing instant, duration and polarity associated with said precompensation value.

3. The measurement system as recited in claim 1 wherein said precompensation value comprises a current level.

4. The measurement system as recited in claim 1 wherein said computational subsystem is at least partially embodied in a sequence of operating instructions executable on a processor.

5. A method of determining characteristics associated with a waveform that compensate for distortion in a transmission medium, comprising:

monitoring a waveform propagating along a transmission medium to detect distortion caused by impedance mismatches associated with said transmission medium; and generating a precompensation signal and precompensation value as a function of said distortion in said waveform, said precompensation value substantially compensating for said distortion when inserted into said waveform as a function of said precompensation signal.

6. The method as recited in claim 5 wherein said precompensation signal comprises at least one of a timing instant, duration and polarity associated with said precompensation value.

7. The method as recited in claim 5 wherein said precompensation value comprises a current level.

8. The method as recited in claim 5 wherein said computational subsystem is at least partially embodied in a sequence of operating instructions executable on a processor.

9. A measurement system for use with a transmission medium, comprising:

a means for detecting distortion caused by impedance mismatches associated with said transmission medium in a waveform propagating along said transmission medium; and a means for generating a precompensation signal and precompensation value as a function of said distortion in said waveform, said precompensation value substantially compensating for said distortion when inserted into said waveform as a function of said precompensation signal.

10. The measurement system as recited in claim 9 wherein said precompensation signal comprises at least one of a timing instant, duration and polarity associated with said precompensation value.

11. The measurement system as recited in claim 9 wherein said precompensation value comprises a current level.

12. The measurement system as recited in claim 9 wherein said means for generating a precompensation signal and precompensation value is at least partially embodied in a sequence of operating instructions executable on a processor.

* * * * *